United States Patent
Yeager et al.

(12) 
(10) Patent No.: US 6,403,229 B2
(45) Date of Patent: Jun. 11, 2002

(54) CYANATE ESTER BASED THERMOSET COMPOSITIONS

(75) Inventors: Gary William Yeager, Niskayuna; Yiqun Pan, Clifton Park, both of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/760,125

(22) Filed: Jan. 16, 2001

Related U.S. Application Data

(60) Division of application No. 09/366,098, filed on Aug. 2, 1999, now Pat. No. 6,245,841, which is a continuation-in-part of application No. 09/096,323, filed on Jun. 11, 1998, now Pat. No. 6,162,876, which is a continuation-in-part of application No. 09/046,278, filed on Mar. 23, 1998, now Pat. No. 6,194,495.

(51) Int. Cl.$^7$ .............. B22F 7/04; B22F 7/08; B32B 15/02; B21C 37/00; C25D 7/04

(52) U.S. Cl. ........ 428/457; 428/607; 428/615; 428/626; 524/100; 524/101; 524/174; 524/176; 524/398; 524/399; 524/400; 525/390; 528/422; 528/423; 528/424

(58) Field of Search ................ 428/457, 607, 428/615, 626; 524/100, 101, 174, 176, 398, 399, 400; 525/390; 528/422, 423, 424

(56) References Cited

U.S. PATENT DOCUMENTS 5,536,765 A * 7/1996 Papathomas ................ 524/100

* cited by examiner

Primary Examiner—Patrick D. Niland
(74) Attorney, Agent, or Firm—S. Bruce Brown; Noreen C. Johnson

(57) ABSTRACT

Laminate structures, for example for use in circuit boards, comprise a metal foil and at least one cured composition layer disposed on at least one surface of the metal foil, wherein the cured composition layer comprises (a) at least one compound selected from the group consisting of cyanate esters and cyanate ester prepolymers, (b) a flame retardant which is substantially toluene soluble and substantially free of hydroxy residues in the cured state, and (c) a curing catalyst.

48 Claims, No Drawings

CYANATE ESTER BASED THERMOSET COMPOSITIONS

This application is a division of Ser. No. 09/366,098, filed Aug. 2, 1999, now U.S. Pat. No. 6,245,841 a continuation-in-part of application Ser. No. 09/096,323, filed Jun. 11, 1998 now U.S. Pat. No. 6,162,876, which is a continuation-in-part of application Ser. No. 09/046,278, filed Mar. 23, 1998 now U.S. Pat. No. 6,194,495.

BACKGROUND OF THE INVENTION

The present invention relates to cyanate ester based compositions. This invention further relates to curable and cured compositions, useful in applications wherein excellent dielectric and thermal properties are desired.

Cyanate esters have been used as curable resins with desirable electrical and thermal properties. As such, they have found utility as matrix resins in at number of industrial applications. Such applications include printed circuit boards, antenna coatings, structural composites, encapsulating resins, matrix resin for abrasives, and adhesives. Chemistry and applications of cyanate esters are discussed in "The Chemistry and Technology of Cyanate Esters" by I. A. Hamerton © 1994 Blackie Academic & Professional, an imprint of Chapman & Hall and references therein.

Cyanate ester resins, as described in U.S. Pat. No. 3,553,244, are produced by reacting aphenolic compound with cyanogen halide. Such cyanate esters, upon curing, are known to form hard thermoset matrices through cyclotrimerization of the cyanate ester groups. The cyclotrimerization produces aryloxytriazine rings which serve as the crosslink sites in the thermoset matrix. The cure of these resins is effected by heating, particularly in the presence of catalysts such as those described in U.S. Pat. Nos. 4,330,658, 4,330,669, 4,785,075, and 4,528,366. Curable compositions containing cyanate ester prepolymers are also known and are described in U.S. Pat. No. 4,740,584. Such prepolymers comprise cyanate ester-containing aryloxytriazine residues that can be further cured through the cyclotrimerization of the remaining cyanate ester moieties. Blends of cyanate ester prepolymers are described in U.S. Pat. Nos. 4,110,364 and 4,371,689. Blends of cyanate esters with thermoplastic polymers are disclosed in U.S. Pat. Nos. 4,157,360, 4,983,683, and 4,902,752.

Many of the aforementioned compositions, however, are not flame retardant and their use in applications, where flame retardancy is critical, is limited. Such applications include electrical applications such as printed circuit boards. Flame retardant cyanate ester blends are described in Japanese Patent No. 5339342 and U.S. Pat. No. 4,496,695, which describe blends of cyanate esters and brominated epoxies, or poly(phenylene ether) (PPE), cyanate esters and brominated epoxies. Epoxy resins however are known to have inferior electrical properties relative to cyanate esters, and the corresponding cyanate ester-epoxy blends do not have optimal electrical properties.

These issues have been addressed by preparing blends of brominated cyanate esters as disclosed in U.S. Pat. Nos. 4,097,455 and 4,782,178. Blends of cyanate esters with the bis(4-vinylbenzylether)s or brominated bisphenols are also described in U.S. Pat. Nos. 4,782,116, and 4,665,154. Blends of cyanate esters with brominated poly(phenylene ether)s, polycarbonates or pentabromobenzylacrylates are disclosed in Japanese Patent No. 08253582.

In European Patent Application 0889096 curable compositions are described comprising a) a cyanate ester compound; b) a monovalent, non-polymeric phenolic compound having no more than 36 carbon atoms; c) an alloy of polyphenylene ether and polystyrene; d) a flame retardant not reactive with the cyanate ester compound; and e) a metal catalyst. The application teaches the use of an alloy of high molecular weight polyphenylene ether with polystyrene. The examples exhibit significant phase separation in the cured state, which can lead to non-uniform thermal and dielectric performance. The application also teaches that addition of PPE-polystyrene alloy to a cyanate ester resin causes significant reductions in its Tg. Such reductions in thermal performance are undesirable since lower Tgs of the cured composition lead to poorer dimensional stability during processing steps, such as soldering, and reduce the high temperature dielectric performance and reliability.

Therefore, there is still a need for curable compositions comprising cyanate esters with optimal thermal performance, flow flame retardancy and electrical properties.

SUMMARY OF THE INVENTION

This need is satisfied by the present invention which provides curable compositions comprising: (a) at least one compound selected from the group consisting of cyanate esters and cyanate ester prepolymers, (b) a flame retardant which is substantially toluene soluble and substantially free of hydroxy residues in the cured state, (c) a curing catalyst. In a preferred embodiment the invention comprises (a) at least one compound selected from the group consisting of cyanate esters and cyanate ester prepolymers, (b) a cyanate ester-free aryloxytriazine, and (c) a curing catalyst. The present compositions provide the desired balance of properties particularly useful in electrical applications.

DETAILED DESCRIPTION OF THE INVENTION

In the compositions of this invention the cyanate ester is represented by the structure of Formula I

Formula I wherein $A^1$ is a $C_{6-1000}$ aromatic or mixed aromatic-aliphatic hydrocarbon radical containing a member or members selected from the group consisting of oxygen, nitrogen, halogen, sulfur, phosphorus, boron, silicon, and hydrogen, and "n" represents an integer from about 1 to about 10. In a preferred embodiment of this invention n represents an integer from about 2 to about 5, and most preferably from about 2 to about 3. Typical of this type are the cyanate ester compounds wherein n is equal to 2. Illustrative examples of cyanate ester compounds are bis(4-cyanatophenyl)methane, bis(3-methyl-4-cyanatophenyl)methane, bis(3-ethyl-4-cyanatophenyl)methane, bis(3,5-dimethyl-4-cyanatophenyl) methane, 1,1-bis(4-cyanatophenyl)ethane, 2,2-bis(4-cyanatophenyl)propane, 2,2-bis(4-cyanatophenyl)1,1,1,3,3,3-hexafluoropropane, di(4-cyanatophenyl)ether, di(4-cyanatophenyl)thioether, di(4-cyanato-2,6-methylphenyl) thioether, di(4-cyanato-2-t-butyl-3-methylphenyl)thioether, 4,4-dicyanatobiphenyl, 1,3-bis(4-cyanatophenyl-1-(1-methylethylidene))-benzene, 1,4-bis(4-cyanatophenyl-1-(1-methylethylidene))benzene and resorcinol dicyanate.

Also useful are cyanated thermoplastic polymers produced by cyanation of free hydroxyl residues of a thermoplastic polymer. Such cyanation may be carried out, for example, by reaction of the hydroxyl groups of a thermoplastic polymer with a cyanogen halide preferably in the presence of a basic compound such as triethylamine. Useful thermoplastic polymers include for example poly(2,6-dimethyl-1,4-phenylene ether) (PPE).

Also useful are cyanate esters of Formula I wherein n is greater than 2. Examples of such materials include the cyanate ester of phenol formaldehyde novolak, cyanate ester of phenol dicyclopentadiene novolak, 1,1,1-tris(4-cyanatophenyl)ethane. It is within the scope of the invention to employ mixtures of two or more different cyanate esters.

Cyanate ester prepolymers that can be used in the present invention contain free cyanate ester groups and may be produced by partial curing of the cyanate ester resin in the presence or absence of a catalyst. A typical example of such a cyanate ester prepolymer is the partial reaction product of bis(3,5-dimethyl-4-cyanatophenyl)methane, sold under the tradename AroCy® M-20 by Ciba. A detailed description of cyanate esters and cyanate ester prepolymers can be found in "The Chemistry and Technology of Cyanate Esters" by I. A. Hamerton© 1994, Blackie Academic and Professional, an imprint of Chapman and Hall, which is incorporated herein by reference. It is within the scope of the invention to employ mixtures of two or more different cyanate ester prepolymers, and mixtures of one or more cyanate ester prepolymers with one or more cyanate ester-containing compounds which are not prepolymers.

Flame retardants suitable for use in embodiments of the present invention are substantially toluene-soluble and are substantially free of hydroxy residues in the cured state. Substantial solubility of the flame retardant in toluene allows for preparation of homogeneous solutions of compositions of the invention which generally enables more uniform impregnation of the fibrous reinforcement and more homogeneous distribution of polymer components in the cured state. This ultimately leads to more uniform electrical and thermal performance in articles comprising compositions of the instant invention. In preferred embodiments the flame retardant component is soluble in toluene at levels of at least about 5 parts, more preferably at least about 15 parts, and most preferably at least about 30 parts per hundred parts of toluene at temperatures preferably below about 30° C.

Flame retardants substantially free of hydroxy groups in the cured state provide compositions with optimum electrical properties, particularly when measured at higher frequency (>1 GHz). Within the context of the present invention flame retardants substantially free of hydroxy groups in the cured state are those which do not contain free hydroxy groups as a component of their molecular structure and those which do not produce hydroxy groups through reaction (for example, by ring-opening of an epoxy group) during compounding, processing, or curing of the compositions of the instant invention. Suitable flame retardant compounds include, but are not limited to, brominated diphenylethers, and tetrabromobisphenol-A-dialkoxydiacrylates, such as tetrabromobisphenol-A diethoxydiacrylate and tetrabromobisphenol-A diethoxydimethacrylate.

Especially preferred flame retardants are cyanate ester-free aryloxytriazines. The cyanate ester-free aryloxytriazines useful in the present invention are illustrated by Formula II:

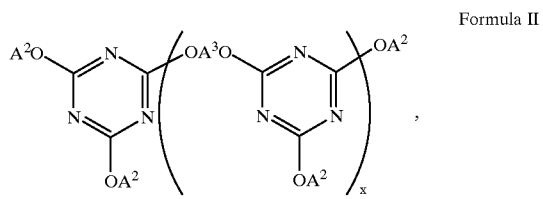

Formula II wherein $A^3$ is divalent, and each $A^2$ and $A^3$ is free of cyanate ester groups. $A^2$ and $A^3$ are independently a $C_{6-200}$ aromatic or alternatively a mixed aromatic-aliphatic hydrocarbon radical, alternatively containing a member or members selected from the group consisting of oxygen, nitrogen, halogen, sulfur, phosphorus, boron, silicon, and mixtures thereof, such that at least one $A^2$ is aromatic; and "x" is between about 0 and about 50. Preferably, both $A^2$ and $A^3$ are aromatic and x is 0 to about 1.

Compounds of Formula II are often prepared by condensation of cyanuric chloride with phenol-containing compounds. Representative phenol-containing compounds suitable for use in synthesizing compounds of Formula II include, but are not limited to, the following: phenol, nonylphenol, dinonylphenol, octylphenol, 3(2-hydroxyphenyl)propionic acid, 3(2-hydroxyphenyl)propanol, 2-methoxy-4-allylphenol, 2-allylphenol, 2,4,6-tribromophenol, 2,4-dibromophenol, 2-bromophenol, 4-bromophenol, 2,6-dibromophenol, 2,3,4,5,6-pentabromophenol, tetrabromocatechol, 2,2-bis(4-hydroxyphenyl)propane, 2,2-bis(4-hydroxy-3-methylphenyl)propane, 2,2-bis(3,5-dimethyl-4-hydroxyphenyl)propane, 1,1-bis(4-hydroxyphenyl)-cyclohexane, 1,1 -bis(4-hydroxyphenyl)cyclopentane, 2,2-bis(3,5-dibromo-4-hydroxyphenyl)propane, bis(4-hydroxyphenyl)methane, 2,2-bis(3-allyl-4-hydroxyphenyl) propane, 2,2-bis(2-t-butyl-4-hydroxy-5-methylphenyl) propane, 2,2-bis(3-t-butyl-4-hydroxy-6-methylphenyl) propane, 2,2-bis(3-t-butyl-4-hydroxy-6-methylphenyl) butane, 1,3-bis[4-hydroxyphenyl-1-(1-methylethylidene)] benzene, 1,4-bis[4-hydroxyphenyl-1-(1-methylethylidene)]-benzene, 1,3-bis[3-t-butyl-4-hydroxy-6-methylphenyl-1-(1-methylethylidene)]-benzene, 1,4-bis[3-t-butyl-4-hydroxy-6-methylphenyl-1-(1-methylethylidene)]-benzene, 4,4'-biphenol,2,2',6,6'-tetramethyl-3,3',5,5,'-tetrabromo-4,4'-biphenol, 2,2',6,6'-tetramethyl-3,3',5-tribromo-4,4'-biphenol, 4,4-bis(4-hydroxyphenyl)heptane, 1,1-bis(4-hydroxyphenyl)-2,2,2-trichloroethane, 2,2-bis(4-hydroxyphenyl-1,1,1,3,3,3-hexafluoropropane), 1,1-bis(4-hydroxyphenyl)-1-cyanoethane, 1,1-bis(4-hydroxyphenyl) dicyanomethane, 1,1-bis(4-hydroxyphenyl)1-cyano-1-phenylmethane, 2,2-bis(3-methyl-4-hydroxyphenyl) propane, 1,1-bis(4-hydroxyphenyl)norbornane, 9,9-bis(4-hydroxyphenyl)fluorene, 3,3-bis(4-hydroxyphenyl) phthalide, 1,2-bis(4-hydroxyphenyl)ethane, 1,3-bis(4-hydroxyphenyl)propenone, bis(4-hydroxyphenyl) sulfone, bis(4-hydroxyphenyl) sulfide, 4,4'-oxydiphenol, 2,2-bis(4-hydroxy-3-methylphenyl)propane, 2,2-bis(3,5-dimethyl-4-hydroxyphenyl)propane, 4,4-bis(4-hydroxyphenyl) pentanoic acid, 4,4-bis(3,5-dimethyl-4-hydroxyphenyl) pentanoic acid, 2,2-bis(4-hydroxyphenyl) acetic acid, hydroquinone, resorcinol, phenol-containing poly (phenylene ether); phenol-containing poly(phenylene ether sulfone), phenol-containing poly(phenylene ether ketone); phenol-containing poly(sulfone), halogenated derivatives thereof, and mixtures thereof.

Preferred cyanate ester-free aryloxytriazine resins useful in the present invention include tris(triphenoxy)-1,3,5- triazine, and substituted derivatives thereof such as tris(2,4,6-tribromophenoxy)-1,3,5-triazine, tris(2-allylphenoxy)-1,3,5-triazine, tris(4-allylphenoxy)-1,3,5-triazine, tris(2-methoxy-4-allylphenoxy)-1,3,5-triazine, tris(4-vinylphenoxy)-1,3,5-triazine, and the bis(2,4,6-tribromophenol)-terminated condensation product of 2,2-bis(3,5-dibromo-4-hydroxyphenyl)propane and cyanuric chloride. In applications requiring UL-94 V-0 flame retardancy, the use of brominated triazines such as tris(2,4,6-tribromophenoxy)-1,3,5-triazine is preferred. The level of incorporation of brominated triazines typically falls in the range from about 10% to about 30% by weight of the total composition. Preferably, the level of incorporation of brominated triazines is from about 12% to about 25% by weight of the total composition, and most preferably from about 15% to about 20% by weight of the total composition.

Catalysts for curing the cyanate ester-containing compositions include a compound selected from the group consisting of metal carboxylate salts, phenols, alcohols, amines, urea derivatives, imidazoles, metal chelates, and mixtures thereof. Preferred catalysts include metal carboxylate salts, or metal acetylacetonate salts, where the metals of the salts are selected from the group consisting of zinc, cobalt, copper, manganese, iron, nickel, aluminum, and mixtures thereof.

It is understood that a catalyst includes low molecular weight or polymeric entities, and as such includes thermoplastics and elastomers. In another embodiment of the present invention, the catalyst is a phenolic compound. Phenolic compounds particularly useful in the present invention are represented by Formula III:

Formula III wherein $A^4$ is $C_{6-1000}$ aryl, wherein said aryl groups are optionally substituted with aryl, $C_{1-20}$ alkyl, alkoxy, aryloxy, carboxy, thio, sulfonyl, containing optionally a member or members selected from the group consisting of oxygen, nitrogen, halogen, sulfur, phosphorus, boron, silicon, hydrogen, and mixtures thereof, and "m" represents an integer from about 1 to about 200, and preferably from about 1 to about 5.

Typical compounds represented by structures of Formula III include, but are not limited to, phenol, alkylphenols such as nonylphenol, or dinonylphenol, octylphenol, 3(2-hydroxyphenyl)propionic acid, 3(2-hydroxyphenyl)propanol, 2-methoxy-4-allylphenol, 2-allylphenol and bisphenols including, but not limited to, 2,2-bis(4-hydroxyphenyl)propane, 2,2-bis(4-hydroxy-3-methylphenyl)propane, 2,2-bis(3,5-dimethyl-4-hydroxyphenyl)propane, 1,1-bis(4-hydroxyphenyl)cyclohexane, 1,1-bis(4-hydroxyphenyl)cyclopentane, 2,2-bis(3,5-dibromo-4-hydroxyphenyl)propane, bis(4-hydroxyphenyl)methane, 2,2-bis(3-allyl-4-hydroxyphenyl)propane, 2,2-bis(2-t-butyl4-hydroxy-5-methylphenyl)propane, 2,2-bis(3-t-butyl-4-hydroxy-6-methylphenyl)propane, 2,2-bis(3-t-butyl-4-hydroxy-6-methylphenyl)butane, 1,3-bis[4-hydroxyphenyl-1-(1-methylethylidine)]benzene, 1,4-bis [4-hydroxyphenyl-1-(1-methylethylidine)]benzene, 1,3-bis[3-t-butyl-4-hydroxy-6-methylphenyl-1-(1-methylethylidine)]benzene, 1,4-bis[3-t-butyl-4-hydroxy-6-methylphenyl-1-(1-methylethylidine)]benzene, 4,4'-biphenol, 2,2',6,6'-tetramethyl-3,3',5,5'-tetrabromo-4,4'-biphenol, 2,2',6,6'-tetramethyl-3,3',5-tribromo-4,4'-biphenol, 4,4-bis(4-hydroxyphenyl)heptane, 1,1-bis(4-hydroxyphenyl)-2,2,2-trichloroethane, 2,2-bis(4-hydroxyphenyl-1,1,1,3,3,3-hexafluoropropane), 1,1-bis(4-hydroxyphenyl)-1-cyanoethane, 1,1-bis(4-hydroxyphenyl)-dicyanomethane, 1,1-bis(4-hydroxyphenyl)1-cyano-1-phenylmethane, 2,2-bis(3-methyl-4-hydroxyphenyl)propane, 1,1-bis(4-hydroxyphenyl)norbornane, 9,9-bis(4-hydroxyphenyl)fluorene, 3,3-bis(4-hydroxyphenyl)phthalide, 1,2-bis(4-hydroxyphenyl)ethane, 1,3-bis(4-hydroxyphenyl)propenone, bis(4-hydroxyphenyl) sulfone, bis(4-hydroxyphenyl) sulfide, 4,4'-oxydiphenol, 2,2-bis(4-hydroxy-3-methylphenyl)propane, 2,2-bis(3,5-dimethyl-4-hydroxyphenyl)propane, 4,4-bis(4-hydroxyphenyl)pentanoic acid, 4,4-bis(3,5-dimethyl-4-hydroxyphenyl)pentanoic acid, 2,2-bis(4-hydroxyphenyl) acetic acid, hydroquinone, resorcinol, and the like.

Phenolic catalysts in the present invention include novolak type resins such as phenol-formaldehyde, cresol-formaldehyde, naphthol-formaldehyde, naphthol-phenol-formaldehyde resins and brominated phenol-formaldehyde resins, phenol-dicyclopentadiene and phenol-polybutadiene resins. Also included are phenol-containing polymers such as phenol-containing poly(phenylene ether); phenol-containing poly(phenylene ether sulfone), phenol-containing poly(phenylene ether ketone); phenol-containing poly(sulfone), and the like. It will be apparent to those skilled in the art that other known catalysts may also be used in the compositions of this invention.

The PPE polymers that can be used in the present invention include all phenol-containing PPE polymers. These materials are generally prepared by oxidative polymerization of a phenol-containing monomer or mixture of phenol-containing monomers in the presence of a catalyst. A variety of catalysts can be used for the preparation of PPE polymers via oxidative polymerization. Illustrative catalysts are carboxylate salts and metal chelates containing at least one transition metal such as copper, manganese, or cobalt. A preferred catalyst system comprises a copper containing compound. Illustrative examples of such catalysts are disclosed in U.S. Pat. Nos. 3,306,874, 3,306,875, 3,914,266 and 4,028,341, and are incorporated herein by reference.

The phenol-containing PPE component of the instant invention, when used as a curing catalyst, comprises structures of Formula IV, but can alternatively comprise a plurality of structural units such as those represented by structures of Formulas V and VI:

Formula IV

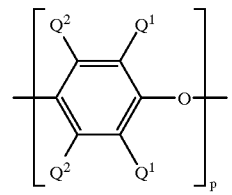

Formula V

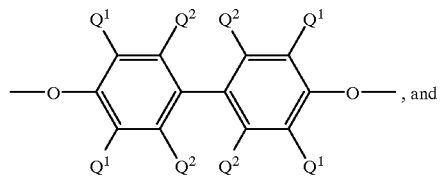

, and

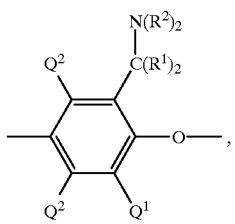

Formula VI wherein $Q^1$ and $Q^2$ independently represent hydrogen, halogen, $C_{1-10}$ alkyl, $C_{6-12}$ aryl, mixed alkyl-aryl hydrocarbons, alkoxy, or thioalkyl; $R^1$ at each occurrence independently represents hydrogen, $C_{1-10}$ alkyl, or $C_{6-10}$ aryl; $R^2$ at each occurrence is independently hydrogen, or $C_{1-20}$, alkyl, preferably a $C_1$–$C_{10}$ alkyl; and "p" represents an integer from about 1 to about 300. Preferably, p is an integer in the range from about 10 to about 160. Most preferably, p is an integer in the range from about 10 to about 60.

The PPE in structure V is formed by reaction of PPE with a diphenoquinone. Reactions between PPE polymers and diphenoquinones yielding incorporated biphenylene units of structure V can occur during polymerization or in subsequent processing steps as is well-known in the art.

Structural units of Formula VI are also observed in poly(phenylene ether)s prepared by oxidative polymerizations carried out in the presence of an amine, preferably a primary or secondary amine, using a copper or manganese containing catalyst. Preferred are structures wherein $R^1$ is hydrogen, and $R^2$ independently represents a $C_{1-10}$ alkyl radical. Numerous beneficial effects, including increased impact strength, and other properties are discussed in U.S. Pat. Nos. 4,054,553, 4,092,294, 4,477,651, and 4,517,341, which are incorporated herein by reference.

Other PPE polymers in the present invention include those that are formed by oxidative copolymerization of phenols; illustrative examples are 2,6-dimethylphenol and 2,3,6-trimethylphenol. Such copolymers are generally classified as poly (2,6-dimethyl-1,4-phenylene-co-2,3,6-trimethyl-1,4-phenylene ether)s. These materials are known to have higher glass transition temperatures than poly(2,6-dimethyl-1,4-phenylene ether), and are expected to impart these properties to the resulting thermoset blend. Also included within this class of polymers are those produced by copolymerization of a mono-phenol such as 2,6-dimethylphenol and a polyfunctional phenol such as the bisphenol, 2,2-bis(3,5-dimethyl-4-hydroxyphenyl)propane, so as to produce a bifunctional phenol-containing polymer. Typical polyfunctional phenols, and the resulting poly (phenylene ether) polymers produced from them, include those described in U.S. Pat. No. 5,352,745, which are incorporated herein by reference.

In certain embodiments of the instant invention allylated derivatives of PPE are also suitable for use. Allylated PPE may be produced by methods known in the art, including allylation of a metallated PPE, oxidative copolymerization of phenols comprising at least one allyl-functionalized phenol, such as 2-allyl-6-methylphenol. Allylated PPE may also be produced by reaction of PPE with an allylation agent, for example in a redistribution process, or in an electrophilic substitution process.

Brominated derivatives of PPE, prepared by addition of bromine to an organic solution of the PPE polymer, are included in the instant invention. Such brominated derivatives are produced-by direct bromination of a PPE. They are also prepared by polymerization of a brominated monomer, or copolymerization of said monomer with another monomer. Typical examples of such processes would include the homopolymerization of 3,4-dibromo-2,6-dimethylphenol or its copolymerization with 2,6-dimethylphenol by means known to one skilled in the art. The homopolymer derived from 2,6-dibromophenol or 2,4,6-tribromophenol under oxidative coupling conditions can also be used.

Reaction products of PPE with compounds containing a carbon-carbon double bond or alcohol group are included in the present invention. Typical of this class of compounds are maleic anhydride, citraconic anhydride, itaconic acid, itaconic anhydride, maleic acid, fumaric acid, citric acid, malic acid, triallylisocyanurate, triallylcyanurate, and diallylphthalate. Generally the reactions are carried out by heating the PPE polymer with a compound containing a carbon—carbon double bond or alcohol at temperatures above about 180° C. either with or without a free radical-producing agent such as a peroxide. More than one of the above carbon—carbon double bond or hydroxyl containing compounds may be reacted with the PPE polymer, either together or sequentially.

For the purposes of this invention, low molecular weight PPE polymers are desirable to provide higher levels of phenol terminal-groups, enhance flow, improve processability, and provide suitable homogeneity with other blend components. PPE polymers used in the instant invention typically have a number average molecular weight (Mn) of between about 1,200 and about 9,700 as measured in chloroform at 25° C. versus polystyrene standards. Preferably, the Mn is between about 2,100 and about 5,900 as measured in chloroform at 25° C. versus polystyrene standards. Most preferably, the Mn is between about 2,100 and about 3,900 as measured in chloroform at 25° C. versus polystyrene standards. As described above, these low molecular weight PPE polymers may be produced by oxidative polymerization.

Alternatively, low molecular weight PPE polymers may be produced by redistribution of PPE with a phenolic compound, such as described by structure III, in the presence of an oxidizing agent.

Oxidizing agents for promoting PPE redistribution include peroxides such as those represented by structures of Formula VII.

$$A^5\text{—O—O—}A^5 \qquad \text{Formula VII}$$

wherein $A^5$ at each occurrence is independently hydrogen, alkyl, aryl, aroyl, alkanoyl, alkenoyl, alkoxycarbonyl, sulfuryl, sulfonyl, or phosphoryl.

Typical of compounds represented by Formula VII are diacyl peroxides such as benzoylperoxide, 4,4'-di-t-butylbenzoyl peroxide or other aryl substituted derivatives, dilauryl peroxide, acetyl benzoylperoxide, acetyl cyclohexylsulfonyl peroxide or diphthaloyl peroxide, peroxydicarbonates such as diacetylperoxydicarbonate, peroxyacids such as perbenzoic acid, 3-chloroperbenzoic acid, 4-nitroperbenzoic and other substituted derivatives of perbenzoic acid, peroxyacetic acid peroxypropanoic acid, peroxybutanoic acid, peroxynonanoic acid, peroxydodecanoic acid, diperoxyglutaric acid, diperoxyadipic acid, diperoxyoctanedioic acid, diperoxynonanedioic acid, diperoxydodecandioic acid, monoperoxyphthalic acid, as well as inorganic peroxyacids such as peroxysulfuric, peroxydisulfuric, peroxyphosphoric, peroxydiphosphoric and their corresponding salts, and peroxycarboxylic esters such as t-butylperformate, t-butyl peracetate, t-butyl peroxyisobutyrate, t-butylperbenzoate, cumyl perbenzoate, t-butyl peroxynonanoate, t-butylmonoperoxymaleate, t-butylmonoperoxyphthalate, di-t-butyl diperoxyadipates, and 2,5-dimethyl-2,5-bis(benzoylperoxy)hexane.

Other suitable oxidizing agents are hexa-substituted ethanes such as 3,4-dimethyl-3,4-diphenylhexane, quinones or diphenoquinones such as benzoquinone and preferably 2,2',6,6'-tetramethyldiphenoquinone (TMDQ).

When PPE is redistributed in the presence of an oxidizing agent and a phenolic compound represented by Formula III, a compound represented by Formula VIII is formed wherein $Q^1, Q^2, A^4$, and m are as previously defined, and p represents an integer from about 1 to about 150. Preferably, p is an integer in the range from about 5 to about 80. Most preferably, p is an integer in the range from about 5 to about 30.

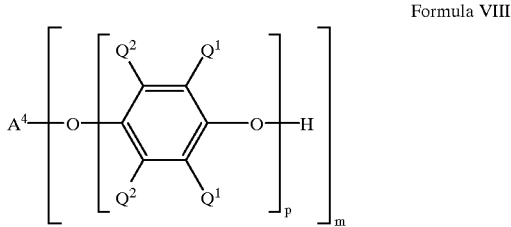

Formula VIII

Low molecular weight PPE polymers can also be prepared by reacting a PPE with an oxidizing agent in the absence of a phenolic compound. This would include, for example, the reaction of a PPE with a peroxide such as benzoyl peroxide or the treatment of a PPE with a quinone such as 2,2',6,6'-tetramethyl diphenoquinone (TMDQ).

The aforementioned structural variations of the PPE are listed to illustrate some of the structures of PPE polymers that can be used in the instant invention. From the foregoing, it will be apparent to those skilled in the art that the PPE polymers contemplated for use in the present invention include all those presently known, irrespective of the method of production, isolation or variations in structural units, ancillary chemical features or modifications.

Within the context of the present invention PPE polymers are free of any polymer having a Tg less than 120° C. containing a styrene residue, such as polystyrene and styrene-butadiene copolymer. PPE polymers free of polymer having a Tg less than 120° C. containing a styrene residue typically have higher heat properties, such as higher glass transition temperature, than do corresponding compositions containing PPE in the presence of such polymer.

Also included in the compositions of the instant invention are curable compositions wherein an extending filler or an additive, or mixtures thereof, may be incorporated in order to impart to or enhance desired properties in the claimed composition. Such desired properties include dielectric constant, dissipation factor, thermal conductivity and flow. Representative examples of extending fillers are carbon black, silica, alumina, magnesia, talc, mica, glass beads, hollow glass beads, and the like. Representative examples of additives are antioxidants, plasticizers, pigments, dyes, colorants, ceramic additives to enhance electrical properties, and flame retardants or agents used to enhance the flame retardancy of the resin. Materials in the additive class include inorganic antimony compounds such as $Sb_2O_3$, $Sb_2O_5$, $NaSbO_3 \cdot \frac{1}{4}H_2O$ and the like. Furthermore an additional thermoset, thermoplastic or elastomeric resin can be included in the compositions of the present invention, either alone or in combination, for the purpose of improving properties such as toughness, impact strength or thermal stability, provided that such polymers are free of any polymer having a Tg less than 120° C.

In one embodiment the present invention includes film and metal-clad film made from the cured or partially cured compositions disclosed herein. Preferably said films are non-reinforced.

In another embodiment the present invention includes compositions containing a reinforcing filler to lend structural integrity to the cured or partially cured composition. Such reinforced compositions are useful in the preparation of laminates. In the production of laminates, impregnation of a resin into a fibrous reinforcing filler is a key initial step. Generally this process involves dissolution of a desired resin composition into an inert organic solvent to reduce resin viscosity and allow for efficient saturation of the fibrous reinforcing filler. The impregnated reinforcement is then heated to volatilize the solvent and partially cure the resin mixture. The resulting article is known as a prepreg.

Reinforcing fillers known to one skilled in the art can be used, including but not limited to, inorganic and organic materials, such as woven or non-woven glass fabrics of the E-, NE-, S-, T- and D-type glasses and quartz, and the like. They may be in the form of glass roving cloth, glass cloth, chopped glass, hollow glass fibers, glass mat, glass surfacing mat, and non-woven glass fabric, ceramic fiber fabrics, and metallic fiber fabrics.

Of particular value are glasses which have very low dissipation factor, preferably less than 0.0015, more preferably less than 0.0010, and most preferably less than 0.0007 measured at 1 MHz. Glasses with suitable dissipation factor are for the most part comprised of various combinations of $Al_2O_3$, $SiO_2$, CaO, $B_2O_3$, MgO, and trace amounts (generally less than 2 parts by weight) of other oxide species. The weight ratios of $Al_2O_3$, $SiO_2$, CaO, $B_2O_3$, MgO, and trace oxide species may vary over a wide range well-known to those skilled in the art to produce glasses with suitable dissipation factors. Preferred glasses are E-, NE-, D- and S-type glasses. For many applications desirable glasses comprise about 0.5–30 parts $Al_2O_3$ about 45–82 parts $SiO_2$, about 0.3–32 parts CaO, and about 2–24 parts $B_2O_3$, all parts being parts by weight. Especially desirable glasses comprise about 15–20 parts $Al_2O_3$, about 50–64 parts $SiO_2$, about 5–10 parts CaO, and about 15–20 parts $B_2O_3$, all parts being parts by weight.

In addition, synthetic organic reinforcing fillers may also be used in the present invention and would include organic polymers capable of forming fibers. Illustrative examples of such reinforcing organic fibers are poly(ether ketone), polyimide benzoxazole, poly(phenylene sulfide), polyesters, aromatic polyamides, aromatic polyimides or polyetherimides, acrylic resins, and poly(vinyl alcohol). Fluoropolymers such as polytetrafluoroethylene, can be used in the present invention. Also included are natural organic fibers known to one skilled in the art, including cotton cloth, hemp cloth, and felt, carbon fiber fabrics, and natural cellulosic fabrics such as Kraft paper, cotton paper, and glass fiber containing paper. Such reinforcing fillers could be in the form of monofilament or multifilament fibers and could be used either alone or in combination with another type of fiber, through, for example, coweaving or core-sheath, side-by-side, orange-type or matrix and fibril constructions or by other methods known to one skilled in the art of fiber manufacture. They could be in the form of, for example, woven fibrous reinforcements, non-woven fibrous reinforcements, or papers.

Coupling agents, incorporated into the reinforcing material, are known in the art to improve adhesion of the fibrous reinforcement to the cured resin composition. For the purposes of this invention, representative coupling agents are silane-, titanate-, zirconate-, aluminum-, and zircoaluminum-based coupling agents and other agents known to one skilled in the art.

The cured composition of the present invention can be used in the form of a film or a laminate structure comprising a metal foil and at least one cured resin composition layer disposed on at least one surface of said metallic foil. Representative metallic foils useful in the present invention are copper foil, aluminum foil and the like. Generally the thickness of the metallic foil is from about 5 micrometers ($\mu$m) to about 200 $\mu$m, and preferably from about 5 $\mu$m to 100 $\mu$m.

The composition may be cured to the desired degree by any of a number of techniques known to one skilled in the art, including heating, exposure to light or an electron beam. When heating is used, the temperature selected can be from about 80° to about 300° C., and preferably from about 120°. to about 240° C. The heating period can be from about 1 minute to about 10 hours, preferably from about 1 minute to about 6 hours, and most preferably from about 3 hours to about 5 hours.

EXAMPLES 1–5

Table 1 shows the molecular weights and intrinsic viscosities of PPE polymers examined in this study. PPE molecular weights were determined by GPC and calculated relative to polystyrene standards. PPE polymers were prepared by A) oxidative polymerization of 2,6-xylenol; or B) redistribution of a 0.40 IV poly(2,6-dimethyl-1,4-phenylene ether) (PPO®, a trademark of the General Electric Co.) with bisphenol-A using a benzoyl peroxide catalyst.

TABLE 1

| PPE Polymer | Method of Preparation | Mn | Mw | Intrinsic Viscosity (IV; dl/g) |
|---|---|---|---|---|
| #1 | A | 18,977 | 46,586 | 0.40 |
| #2 | A | 5,105 | 23,642 | 0.14 |
| #3 | B | 4,329 | 12,801 | 0.12 |
| #4 | A | 2,197 | 7,882 | 0.12 |

Method A. Oxidative coupling of 2,6-xylenol. Method B. Redistribution of PPE Polymer 1 with 4 wt. % 2,2-bis(4-hydroxyphenyl)propane and 4 wt. % benzoyl peroxide.

Cured cyanate ester-triazine laminates were generated by initially preparing a 50% (weight percent) solution of the curable composition in toluene (Tables 2, 3, 4).

After formulation as described above, the desired reinforcement was impregnated with the resin solution. The resulting impregnated fabric was heated at 150° C. for 7 minutes to remove solvent and partially cure the thermoset. The resulting reinforced prepregs were layered and heated in a compression mold at approximately 200° C. for 3 hours so as to produce 6–8 ply laminates.

Table 2 shows physical properties for typical E-glass reinforced cyanate ester-triazine compositions cured using zinc octoate and phenol-containing compound as catalysts. Examples 3–5 show typical E-glass reinforced cyanate ester-triazine compositions cured using a zinc octoate catalyst and PPE polymer catalyst. As shown these resins produced laminates typically with glass transition temperatures of 231–235 ° C., dielectric constants ranging from 3.4–4.5 and dissipation factors ranging from 0.0014–0.0016. The excellent electrical and thermal properties of these compositions make them extremely useful in applications such as printed circuit boards, antenna coatings, radome structures, encapsulating resins, matrices for abrasives, or thermosetting adhesives.

TABLE 2

E-glass reinforced cyanate ester-triazine compositions. All components given in parts by weight. Samples prepared using 7628 style E-glass reinforcement.

| Formulation # | 1 | 2 | 3 | 4 | 5 |
|---|---|---|---|---|---|
| Cyanate Ester Component | | | | | |
| bis(4-cyanato-3,5-dimethyl-phenyl) methane (M-10; Ciba-Geigy Co.) | 79.85 | — | 54.70 | 27.35 | 54.85 |
| 1,3-bis(4-cyanatophenyl-1-(1-methylethylidine)) benzene (XU-366; Ciba-Geigy Co.) | — | 79.85 | — | — | — |
| bis(4-cyanato-3,5-dimethyl-phenyl) methane prepolymer (M-20; Ciba-Geigy Co.) | — | — | — | 27.35 | — |
| Aryloxy Triazine Component | | | | | |
| Tris(2,4,6-tribromophenoxy)-1,3,5-triazine | 15.00 | 15.00 | 15.00 | 15.00 | 20.00 |
| Phenolic Component | | | | | |
| 4-(t-octyl)phenol | 5.00 | 5.00 | — | — | — |
| PPE Polymer #3 | — | — | 30.00 | 30.00 | — |
| PPE Polymer #2 | — | — | — | — | 25.00 |
| Additional Curing Catalyst | | | | | |
| Zinc octoate | 0.15 | 0.15 | 0.30 | 0.30 | 0.15 |
| Properties | | | | | |
| Glass Transition Temperature (Tg) | 232 | 182 | 235 | 230 | 231 |
| z-axis expansion | — | — | 2.01 | 2.01 | — |
| dichloromethane resistance | good | good | good | good | fair |

TABLE 2-continued

E-glass reinforced cyanate ester-triazine compositions. All components given in parts by weight. Samples prepared using 7628 style E-glass reinforcement.

| Formulation # | 1 | 2 | 3 | 4 | 5 |
|---|---|---|---|---|---|
| Resin Content | 28.44 | 29.24 | 27.8 | 51.7 | 35.5 |
| Dielectric Constant (1 MHz) | 4.36 | 4.34 | 4.50 | 3.40 | — |
| Dissipation Factor (1 MHz) | 0.0030 | 0.0020 | 0.0016 | 0.0014 | — |
| UL-94 Flammability | V-0 | V-0 | V-0 | V-0 | V-0 |
| Moisture Absorption | 0.17 | 0.08 | 0.21 | 0.22 | 0.15 |
| Solder Resistance | good | good | good | good | good |

EXAMPLES 6–7

Because the availability of low molecular weight PPE polymers is not widespread, in situ preparation of low molecular weight PPE polymers from readily available, higher molecular weight PPE polymers is of particular importance in this invention. As shown this can be accomplished by redistribution of a 0.40 IV PPO® polymer (General Electric Co.) with 2,2-bis(4-hydroxyphenyl) propane (bisphenol-A) and a benzoyl peroxide oxidizing agent, or with an oxidizing agent alone. Table 3 shows the results of PPE-cyanate ester-triazine compositions prepared by this method. In this instance, 2,2-bis(4-hydroxyphenyl) propane and benzoyl peroxide were used at levels of 4 weight percent of the PPO amount or 1.11 weight percent of the total composition.

TABLE 3

E-glass reinforced cyanate ester-triazine compositions containing PPE as curing catalyst. All components given in parts by weight. Samples prepared using 7628 style E-glass reinforcement.

| Formulation # | 6 | 7 |
|---|---|---|
| Cyanate Ester Component | | |
| bis(4-cyanato-3,5-dimethyl-phenyl) methane (M-10; Ciba-Geigy Co.) | 54.76 | 46.53 |
| bis(4-cyanato-3,5-dimethyl-phenyl) methane prepolymer (M-20; Ciba-Geigy Co.) | — | 8.23 |
| Aryloxy Triazine Component | | |
| Tris(2,4,6-tribromophenoxy)-1,3,5-triazine | 15.01 | 15.01 |
| Phenolic Resin Component | | |
| PPE Polymer #1 | 27.81 | 27.81 |
| Benzoyl Peroxide | 1.11 | 1.11 |
| Bisphenol-A | 1.11 | 1.11 |
| Additional Curing Catalyst | | |
| Zinc octoate | 0.20 | 0.15 |
| Properties | | |
| Glass Transition Temperature (Tg) | 225 | 215 |
| dichloromethane resistance, % (M-2/23) | 0.83 | 1.02 |
| Copper Peel Strength | 10.5 | 10.5 |
| Resin Content (%) | 37.4 | 41.4 |
| Dielectric Constant (1 MHz) | 3.959 | 3.854 |
| Dissipation Factor (1 MHz) | 0.00268 | 0.00267 |
| Moisture Absorption (%) | 0.13 | 0.11 |
| UL-94 Flammability | V-0 | V-0 |
| Burn Time (seconds) | 11.1 | 24.6 |
| Solder Resistance (seconds to blister @ 550 F.) | 300 | 300 |

EXAMPLE 8

This example employs a PPE prepared by redistribution reaction carried out just prior to formulation without isolation of the PPE polymer. A resin solution was prepared using 30 parts by weight 2,2-bis(4-cyanatophenyl)propane (B-10; Ciba-Geigy Co.), 15 parts by weight tris(2,4,6-tribromophenoxy)-1,3,5-triazine, 50 parts by weight PPE (#4 from Table 1), 0.021 parts by weight zinc octoate, and 5 parts by weight polytetrafluoroethylene. An E-glass reinforcement (7628 style) was treated with the resin solution as in Examples 1–5. The laminate obtained had a dielectric constant of 4.0 at 2.4 GHz and 3.9 at 10 GHz; and dissipation factor 0.00427 at 2.4 GHz and 0.00551 at 10 GHz.

EXAMPLES 9–13

Table 4 shows typical NE-glass reinforced cyanate ester-triazine compositions cured using zinc octoate and phenol-containing compound as catalysts. Examples 9–13 show typical NE-glass reinforced cyanate ester-triazine compositions cured using a zinc octoate catalyst and PPE polymer catalyst.

TABLE 4

NE-glass reinforced cyanate ester-triazine compositions. All components given in parts by weight.

| Formulation # | 9 | 10 | 11 | 12 | 13 |
|---|---|---|---|---|---|
| Cyanate Ester Component | | | | | |
| 2,2-bis(4-cyanatophenyl)propane (B-10; Ciba-Geigy Co.) | 55 | 55 | 45 | 45 | 55 |

TABLE 4-continued

NE-glass reinforced cyanate ester-triazine compositions. All components given in parts by weight.

| Formulation # | 9 | 10 | 11 | 12 | 13 |
|---|---|---|---|---|---|
| Aryloxy Triazine Component | | | | | |
| Tris(2,4,6-tribromophenoxy)-1,3,5-triazine | 15 | 15 | 15 | 15 | 15 |
| Phenolic Component | | | | | |
| PPE Polymer #3 | 30 | 30 | 40 | 40 | — |
| PPE Polymer #2 | — | — | — | — | 30 |
| Additional Curing Catalyst | | | | | |
| Zinc octoate | 0.0375 | 0.0375 | 0.0375 | 0.0375 | 0.0375 |
| NE glass | | | | | |
| style | 2116 | 1080 | 2116 | 1080 | 2116 |
| Properties | | | | | |
| Dielectric Constant (2.4 GHz) | 3.4 | 3.39 | 3.37 | 3.36 | 3.42 |
| Dielectric Constant (10 GHz) | — | — | — | — | 3.31 |
| Dissipation Factor (2.4 GHz) | .00423 | .00386 | .00353 | .00390 | .00421 |
| Dissipation Factor (10 GHz) | — | — | — | — | .00478 |

What is claimed is:

1. A laminate structure comprising a metal foil and at least one cured composition layer disposed on at least one surface of the metal foil, wherein the cured composition layer comprises a reaction product of (a) at least one compound selected from the group consisting of cyanate esters and cyanate ester prepolymers, (b) a flame retardant which is substantially toluene soluble and substantially free of hydroxy residues in the cured state; and (c) a curing catalyst, wherein the curing catalyst is a combination of (I) at least one phenol-containing compound, and (II) at least one compound selected from the group consisting of a metal carboxylate salt and a metal acetylacetonate salt, where the metal of the salt is selected from the group consisting of zinc, copper, manganese, cobalt, iron, nickel, aluminum, and mixtures thereof.

2. The laminate of claim 1 wherein the cured composition layer further comprises a reinforcement.

3. The laminate of claim 1 wherein the curing catalyst is a combination of at least one member selected from the group consisting of zinc octoate, zinc acetylacetonate, manganese acetylacetonate, copper acetylacetonate, and cobalt acetylacetonate, and at least one member selected from the group consisting of phenol-containing poly(ether)sulfone, phenol-containing poly(phenylene ether), octyl phenol, nonyl phenol, and phenol formaldehyde novolak.

4. The laminate of claim 1, which is free of polymer having a Tg less than 120° C. containing a styrene residue.

5. The laminate structure of claim 1 wherein the flame retardant comprises a cyanate ester-free aryloxytriazine.

6. The laminate structure of claim 5 wherein the cyanate ester-free aryloxytriazine contains at least one bromine atom.

7. The laminate structure of claim 5 wherein the cyanate ester is represented by a structure of Formula 1:

$$A^1-(OCN)_n \qquad \text{Formula I}$$

wherein:

A$^1$ is a C$_{6-1000}$ aromatic or a mixed aromatic-aliphatic radical, containing a member or members selected from the group consisting of oxygen, nitrogen, halogen, sulfur, phosphorus, boron, silicon, hydrogen, and mixtures thereof; and n represents an integer from about 1 to about 10.

8. The laminate structure of claim 7 wherein n represents an integer from about 2 to about 5.

9. The laminate structure of claim 5 wherein the aryloxytriazine is tris(phenoxy)triazine, tris-(2,4,6-tribromophenoxy)-1,3,5-triazine or the bis(2,4,6-tribromophenol)-terminated condensation product of 2,2-bis(3,5-dibromo-4-hydroxyphenyl)propane and cyanuric chloride.

10. The laminate structure of claim 1 wherein the phenol-containing compound is selected from the group consisting of phenol-containing poly(2,6-dimethyl-1,4-phenylene ether), phenol-containing poly(2,3,6-(trimethyl-1,4-phenylene ether), phenol-containing poly(2,6-dimethyl-1,4-phenylene-co-2,3,6-trimethyl-1,4-phenylene ether), phenol-containing poly(2,6-dibromo-1,4-phenylene ether), phenol-containing poly(2,6-dimethyl-1,4-phenylene-co-2,6-dibromo-1,4-phenylene ether), and mixtures thereof.

11. The laminate structure of claim 1 wherein the phenol-containing compound is the reaction product of a poly(phenylene ether), a bisphenol, and an oxidizing agent.

12. The laminate structure of claim 11 wherein the poly(phenylene ether) has a number average molecular weight between about 1,200 and about 8,000.

13. The laminate structure of claim 1 wherein the phenol-containing compound is the reaction product of a poly(phenylene ether), and an oxidizing agent.

14. The laminate structure of claim 1 wherein the phenol-containing compound is the reaction product of a poly(phenylene ether) and a compound containing a carbon—carbon double bond, or an alcohol group.

15. The laminate structure of claim 2 wherein the reinforced cured composition layer further comprises an organic or an inorganic extending filler.

16. The laminate structure of claim 15 wherein the reinforced cured composition layer is reinforced using an inorganic or organic reinforcing filler.

17. The laminate structure of claim 2 wherein the reinforced cured composition layer is reinforced using an inorganic or organic reinforcing filler.

18. The laminate structure of claim 17 wherein the reinforced cured composition layer is reinforced with a fibrous glass filler.

19. The laminate structure of claim 18 in which the fibrous glass filler comprises about 0.5–30 parts $Al_2O_3$, about 45–82 parts $SiO_2$, about 0.3–32 parts CaO, and about 2–24 parts $B_2O_3$, all parts being parts by weight.

20. The laminate structure of claim 19 in which the fibrous glass filler comprises about 15–20 parts $Al_2O_3$, about 50–64 parts $SiO_2$, about 5–10 parts CaO, and about 15–20 parts $B_2O_3$, all parts being parts by weight.

21. The laminate structure of claim 18 in which the fibrous glass filler has a dissipation factor less than 0.0015 measured at 1 MHz.

22. The laminate structure of claim 18 in which the fibrous glass filler has a dissipation factor less than 0.001 measured at 1 MHz.

23. The laminate structure of claim 18 in which the fibrous glass filler has a dissipation factor less than 0.0007 measured at 1 MHz.

24. The laminate structure of claim 18 wherein the fibrous glass filler is E-glass.

25. The laminate structure of claim 18 wherein the fibrous glass filler is S-glass.

26. The laminate structure of claim 2 wherein the reinforced cured composition layer comprises at least one of an inorganic or an organic extending filler and an organic or inorganic reinforcing filler.

27. A laminate structure comprising a metal foil and at least one reinforced, cured composition layer disposed on at least one surface of the metal foil, wherein the reinforced cured composition layer comprises a reaction product of:
   (a) at least one compound selected from the group consisting of cyanate esters and cyanate ester prepolymers, wherein the cyanate ester is selected from the group consisting of 2,2-bis(4-cyanatophenyl)propane, bis(3,5-dimethyl-4-cyanatophenyl)methane, 1,3-bis[4-cyanatophenyl-1-(1-methylethylidene)]benzene, 1,4-bis[4-cyanatophenyl-1-(1-methylethylidene)]-benzene, and mixtures thereof, and the cyanate ester prepolymer is selected from the group consisting of prepolymers of 2,2-bis(4-cyanatophenyl)-propane, bis(3,5-dimethyl-4-cyanatophenyl)methane, 1,3-bis[4-cyanatophenyl-1-(1-methylethylidene)]benzene, 1,4-bis[4-cyanatophenyl-1-(1-methylethylidene)]benzene, and mixtures thereof;
   (b) tris(2,4,6-tribromophenoxy)-1,3,5-triazine; and
   (c) a curing catalyst, wherein the curing catalyst is a combination of at least one member selected from the group consisting of zinc octoate, zinc acetylacetonate, manganese acetylacetonate, copper acetylacetonate, and cobalt acetylacetonate, and at least one member selected from the group consisting of phenol-containing poly(ether)sulfone, phenol-containing poly(phenylene ether), octyl phenol, nonyl phenol, phenol formaldehyde novolak.

28. The laminate structure of claim 27 wherein the curing catalyst is a combination of zinc octoate and phenol-containing poly(phenylene ether).

29. The laminate structure of claim 27 wherein the reinforced cured composition layer further comprises an organic or an inorganic extending filler.

30. The laminate structure of claim 27 wherein the reinforced cured composition layer comprises an organic or inorganic reinforcing filler.

31. The laminate structure of claim 30 wherein the reinforced cured composition layer is reinforced with a fibrous glass filler.

32. The laminate structure of claim 31 in which the fibrous glass filler comprises about 0.5–30 parts $Al_2O_3$, about 45–82 parts $SiO_2$, about 0.3–32 parts CaO, and about 2–24 parts $B_2O_3$, all parts being parts by weight.

33. The laminate structure of claim 32 in which the fibrous glass filler comprises about 15–20 parts $Al_2O_3$, about 50–64 parts $SiO_2$, about 5–10 parts CaO, and about 15–20 parts $B_2O_3$, all parts being parts by weight.

34. The laminate structure of claim 31 in which the fibrous glass filler has a dissipation factor less than 0.0015 measured at 1 MHz.

35. The laminate structure of claim 31 in which the fibrous glass filler has a dissipation factor less than 0.001 measured at 1 MHz.

36. The laminate structure of claim 31 in which the fibrous glass filler has a dissipation factor less than 0.0007 measured at 1 MHz.

37. The laminate structure of claim 31 wherein the fibrous glass filler is E-glass.

38. The laminate structure of claim 31 wherein the fibrous glass filler is S-glass.

39. The laminate structure of claim 27 wherein the reinforced cured composition layer comprises an inorganic or an organic extending filler and an organic or inorganic reinforcing filler.

40. A laminate structure comprising a metal foil and a reinforced, cured composition layer disposed on at least one surface of the metal foil, wherein the reinforced cured composition layer comprises a reaction product of:
   (a) a cyanate ester prepolymer of bis(3,5-dimethyl-4-cyanato-phenyl)methane and at least one cyanate ester selected from the group consisting of bis(3,5-dimethyl-4-cyanatophenyl)methane, and 1,3-bis(4-cyanatophenyl-1-(1-methylethylidene))benzene;
   (b) tris(2,4,6-tribromophenoxy)-1,3,5-triazine; and
   (c) a catalyst comprising zinc octoate and a phenol-containing polymer, wherein the phenol-containing polymer comprises the reaction product of a poly(phenylene ether), a bisphenol, and an oxidizing agent,
   wherein the reinforced cured composition layer is reinforced with a fibrous glass filler.

41. The laminate structure of claim 40 wherein the poly(phenylene ether) is poly(2,6-dimethyl-1,4-phenylene ether), the bisphenol is bisphenol A and the oxidizing agent is benzoyl peroxide.

42. The laminate structure of claim 40 in which the fibrous glass filler comprises about 0.5–30 parts $Al_2O_3$, about 45–82 parts $SiO_2$, about 0.3–32 parts CaO, and about 2–24 parts $B_2O_3$, all parts being parts by weight.

43. The laminate structure of claim 45 in which the fibrous glass filler comprises about 15–20 parts $Al_2O_3$, about 50–64 parts SiO2, about 5–10 parts CaO, and about 15–20 parts $B_2O_3$, all parts being parts by weight.

44. The laminate structure of claim 40 in which the fibrous glass filler has a dissipation factor less than 0.0015 measured at 1 MHz.

45. The laminate structure of claim 40 in which the fibrous glass filler has a dissipation factor less than 0.001 measured at 1 MHz.

46. The laminate structure of claim 40 in which the fibrous glass filler has a dissipation factor less than 0.0007 measured at 1 MHz.

47. The laminate structure of claim 40 wherein the fibrous glass filler is E-glass.

48. The laminate structure of claim 40 wherein the fibrous glass filler is S-glass.

* * * * *